(12) United States Patent
Zook

(10) Patent No.: US 6,552,522 B1
(45) Date of Patent: Apr. 22, 2003

(54) WIRE CUTTER TOOL WITH INTEGRAL INSULATION PIERCING CIRCUIT TESTER

(76) Inventor: Grant W. Zook, 436 Smokepipe Rd., Souderton, PA (US) 18964

( * ) Notice: Subject to any disclaimer, the term of this patent is extended or adjusted under 35 U.S.C. 154(b) by 0 days.

(21) Appl. No.: 09/693,095

(22) Filed: Oct. 20, 2000

Related U.S. Application Data

(63) Continuation-in-part of application No. 09/100,598, filed on Jun. 22, 1998, now abandoned, which is a continuation-in-part of application No. 08/854,366, filed on May 12, 1997, now abandoned.

(51) Int. Cl.[7] ............................................. G01R 31/02
(52) U.S. Cl. ..................................... 324/72.5; 324/522
(58) Field of Search .............................. 324/72.5, 133, 324/149, 155, 156, 522, 555, 556

(56) References Cited

U.S. PATENT DOCUMENTS

| | | | |
|---|---|---|---|
| 1,738,287 A | * 12/1929 | Dirksen | 324/555 |
| 3,337,801 A | * 8/1967 | Rinier et al. | 324/133 |
| 3,404,340 A | * 10/1968 | Labrie | 324/72.5 |
| 3,626,358 A | * 12/1971 | Klassen | 324/72.5 |
| 4,225,990 A | * 10/1980 | Theiler, Sr. | 7/107 |
| 4,361,800 A | * 11/1982 | Fodali et al. | 324/556 |
| 4,709,206 A | * 11/1987 | Edwards et al. | 324/72.5 |
| 4,736,480 A | * 4/1988 | Bohl et al. | 324/72.5 |
| 5,424,630 A | * 6/1995 | Vazquez | 324/72.5 |
| 5,497,522 A | * 3/1996 | Chen | 7/128 |
| 5,711,182 A | * 1/1998 | Yang | 72/409.14 |
| 5,893,185 A | * 4/1999 | Okrepkie et al. | 7/107 |
| 6,009,582 A | * 1/2000 | Harrison et al. | 7/118 |

* cited by examiner

Primary Examiner—N. Le
Assistant Examiner—T. R. Sundaram
(74) Attorney, Agent, or Firm—LaMorte & Associates

(57) ABSTRACT

A tool for diagnosing and repairing defective wires. The tool is configured as a pair of pliers, wherein the pliers have the ability to cut, strip and twist wire. The pliers also contain two different piercing probes. The first piercing probe extends away from the body of the pliers, thereby enabling the pliers to be used as a circuit testing probe. The second piercing probe is located at a specific point on the jaws of the pliers. When a wire is placed in the jaws of the pliers at that point, the wire becomes pierced by the second piercing probe as the plier jaws close. The force at which the second piercing probe is biased against the wire is determined by the degree of manual force applied to the handles of the pliers. As either piercing probe pierces the insulation surrounding a wire, the body of the pliers is brought to the same electrical potential as the wire. A wire lead extends from the pliers and connects to a ground potential at a remote location. The pliers contain a current flow indicator that is capable of providing a perceivable indication as to the flow of current though the pliers.

20 Claims, 3 Drawing Sheets

WIRE CUTTER TOOL WITH INTEGRAL INSULATION PIERCING CIRCUIT TESTER

RELATED APPLICATIONS

This application is a continuation-in-part of U.S. patent application Ser. No. 09/100,598, now abandoned, entitled Wire Cutter Tool With Integral Insulating Piercing Circuit Tester, filed Jun. 22, 1998, which is a C.I.P. of Ser. No. 08/854,366 filed May 12, 1997 abn.

BACKGROUND OF THE INVENTION

1. Field of the Invention

The present invention generally relates to wire cutters that are specifically designed to cut wire and strip the insulation from wire. The present invention also relates to circuit testing probes of the type that test for electricity flowing through a wire by extending a piercing probe through the insulation of the wire and directing the electricity through a test circuit.

2. Description of the Prior Art

In many situations, a person testing or repairing electrical equipment must determine if electricity is flowing through a specific wire. Often the ends of the wire are unaccessible. As a result, a person must invasively test for the flow of electricity by piercing the insulation on the wire. In the prior art, there are many different types of circuit testing devices that are specifically designed to pierce the insulation on a wire and test for the flow of electricity through that wire. One such prior art device is the open end probe. Open end probes are probes that terminate at one end with a sharp implement. The implement is designed to pierce the insulation around a wire and contact the conductive core of the wire. The problem associated with open end probes is that there is nothing that holds the wire in place as the implement at the end of the probe is attempting to pierce the insulation around a wire. As a result, open end probes often slip and damage the insulation surrounding a wire without contacting the conducive core in the center of the wire. If a person is using his/her hand to hold a wire in place, a slipping open end probe presents a physical danger to that person because the probe can easily pierce the skin.

To eliminate the disadvantages of open end probes, hook end probes have been developed in the prior art. Hook end probes contain a hook structure opposite the piercing probe. A wire to be tested is placed in between the hook structure and the piercing probe. The hook structure holds the wire in place as the piercing probe advances against the wire. As a result, the piercing probe properly contacts the wire and the dangers of a slipping probe are eliminated. The problem with hook end test probes is that such test probes typically contain set springs. The set springs determine how hard the piercing probe is driven against a wire placed into the hook end probe. Wire comes in many different shapes and types. If a piercing probe is pressed too hard against a wire, the probe may sever the conductive core in the center of that wire. If the piercing probe is not pressed hard enough against a wire, the probe may not fully pierce that wire's insulation. As a result, a probe with a set spring bias is incapable of working properly on all types of wires.

In many situations, a person using a test probe is testing a single wire located in a much larger bundle of wires. When a problem wire is detected, that person typically must remove the test probe and retrieve tools needed to repair the detected problem. Often during this process, the problem wire becomes lost within the larger bundle or the problem point on the suspect wire becomes lost as the repair worker directs his/her attention to finding tools. In the prior art, devices have been developed that help isolate a single wire in a bundle. However, plier-based circuit testers need room for the jaws of the circuit tester to open. In very confined areas, pliers cannot be used and a probe-based circuit tester is necessitated.

From the above, it can be seen that both plier based circuit testers and probe based circuit testers have both their own advantages and disadvantages. A need therefore exists in the art for a test probe that embodies the advantages of both a plier-based circuit tester and a probe-based circuit tester. This need is met by the present invention as described and claimed below.

SUMMARY OF THE INVENTION

The present invention is a tool for diagnosing and repairing defective wires. The tool is configured as a pair of pliers, wherein the pliers have the ability to cut, strip and twist wire. The pliers also contain two different piercing probes. One piecing probe extends from the body of the pliers, thereby enabling the pliers to be used as an open end circuit testing probe. The second piercing probe is located at a specific point on the jaws of the pliers. When a wire is placed in the jaws of the pliers at that point, the wire becomes pierced by the second piercing probe as the plier jaws close. The force at which the second piercing probe is biased against the wire is determined by the degree of manual force applied to the handles of the pliers.

As either of the piercing probes pierce the insulation surrounding a wire, the body of the pliers is brought to the same electrical potential as the wire. A wire lead extends from the pliers and connects to a ground potential at a remote location. The pliers contain a current flow indicator that is capable of providing a perceivable indication as to the flow of current though the pliers. If the indicator indicates that there is a flow of current, then the wire being tested is known to be functional. However, if a point in a wire is detected where the flow of current stops, the wire is known to be defective and the pliers can be used to cut, strip and recombine the wire in making the needed repair.

BRIEF DESCRIPTION OF THE DRAWINGS

For a better understanding of the present invention, reference is made to the following description of an exemplary embodiment thereof, considered in conjunction with the-accompanying drawings, in which.

DETAILED DESCRIPTION OF THE DRAWINGS

Figure 1:
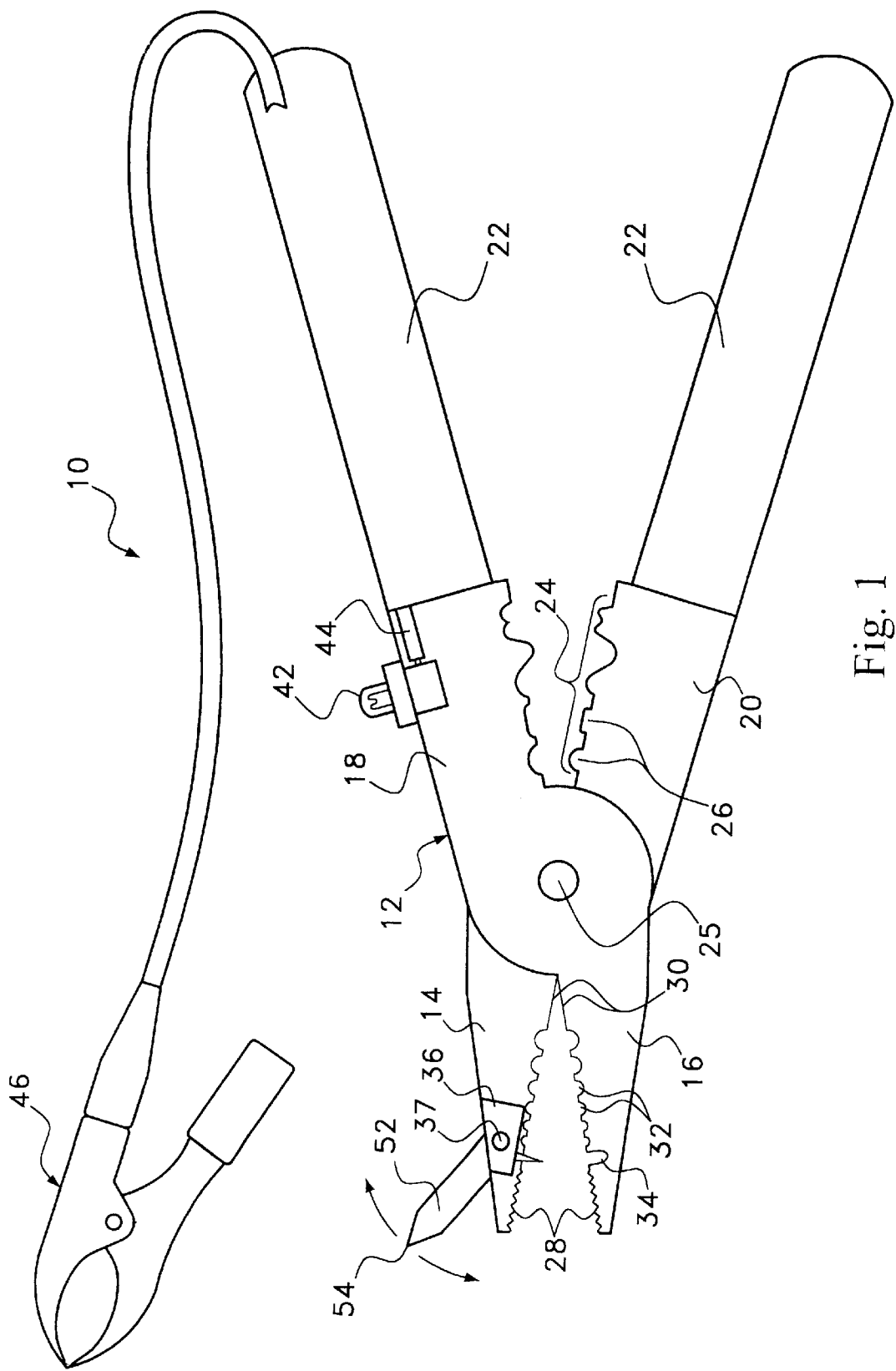
FIG. 1 is a front view of one exemplary embodiment of the present invention device shown in an open condition.

Referring to FIG. 1, there is shown one preferred embodiment of the present invention device 10. The present invention device 10 is generally configured as a pair of pliers 12. The pliers 12 have two jaws elements 14, 16 and two handle elements 18, 20, as is typical for most hand held pliers. The pliers 12 can have any configuration such as that of needle nose pliers, bull nose plies, or the like. However, in the preferred embodiment, the pliers 12 are configured as electrician pliers, as is shown.

The pliers 12 are made of a conductive material, such as steel. The handle elements 18, 20 of the pliers 12 are covered with insulating material 22 that prevents conductive contact in between the hands of a person holding the pliers 12 and the conductive material of the pliers 12. The piers 12 also contain a crimping region 24 located in between the top of the insulating material 22 and the pivot 25. The crimping region 24 contains different sized and shaped crimping teeth 26 that are designed to crimp different types of electrical connectors onto wire.

The jaw elements 14, 16 of the pliers 12 are configured so that each of the jaw elements 14, 16 contains a gripping region 28 near its end. The gripping region 28 is capable of gripping wire, twisting wire, untightening bolts and performing similar functions. The jaw elements 14, 16 also contain a cutting region 30 proximate the pivot. The cutting region 30 has a sharpened edge and is capable of cutting wire of various gauge sizes. Wire stripping reliefs 32 of various radii are disposed on the face of each jaw element 14, 16 in between the gripping region 28 and the cutting region 30. The stripping reliefs 32 are used to cut and strip the insulation from a variety of different gauge wires. As such, each of the wire cutting reliefs 32 has a sharpened edge that enable it to cut the insulation on a wire.

A semicircular relief 34 is formed in the lower jaw element 16 in between the gripping region 28 and the wire stripping reliefs 34. The semicircular relief 34 does not have any sharpened edges. As a result, when a wire passes into the semicircular relief 34, no damage is caused to the insulation surrounding the wire. On the upper jaw element 14, opposite the semicircular relief 34, is positioned a conductive protrusion 36. The conductive protrusion 36 can be forged as part of the upper jaw element 14. However, in the shown embodiment, the conductive protrusion 36 is a small metal block that is affixed to the upper jaw element 14 with a mechanical fastener 37. A short piercing probe 40 extends from the conductive protrusion 36. If the conductive protrusion is forged as part of the upper jaw element 14, then the short piercing probe 40 should be threaded into the conductive protrusion or otherwise connected to the conductive protrusion in a removable manner. This enables the short piercing probe 40 to be replaced when damaged or dulled. If the conductive protrusion 36 is a removable block, as is shown, then the short piercing probe 40 can be permanently affixed to the removable block 36. In such a scenario, the short piercing probe 40 can be periodically changed by replacing the entire removable block 36.

The short piercing probe 40 is made of conductive material. As such, the short piercing probe 40, conductive protrusion 36 and upper jaw element 14 are electrically interconnected. The short piercing probe 40 is located directly above the semicircular relief 34 on the lower jaw element 16. When the pliers 12 are closed and the upper and lower jaw elements 14, 16 abut against each other, (see FIG. 2), the tip of the short piercing probe 40 extends to a depth generally equal to the bottom of the semicircular relief 34.

Figure 2:
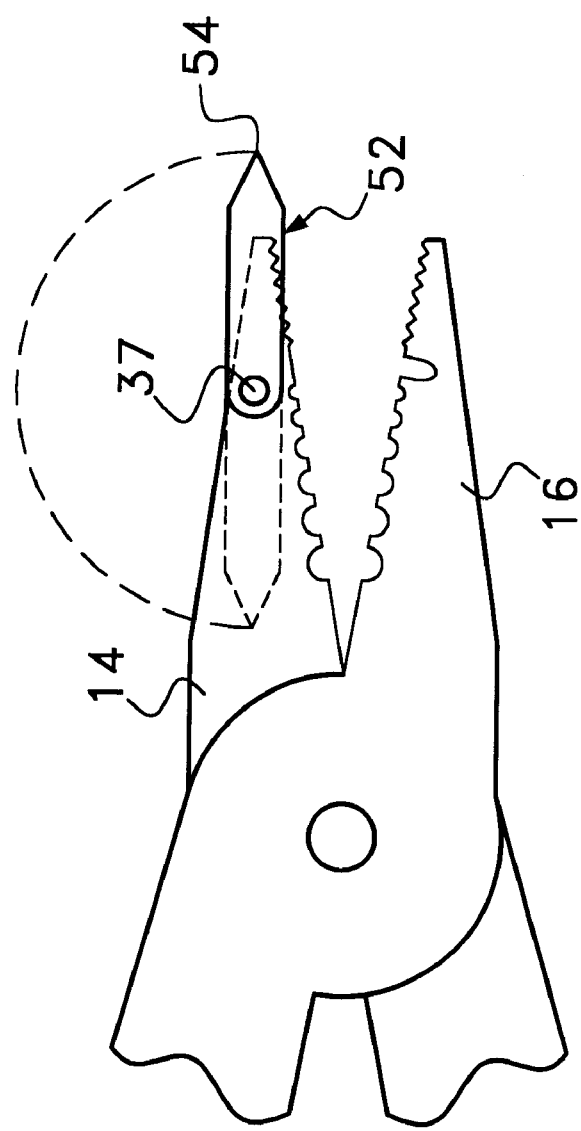
FIG. 2 is a rear view of the jaw section of the plier shown in FIG. 1.

A long piercing probe 52 is also connected to the upper jaw element 14 of the pliers 12. The long piercing probe 52 is pivotably connected to the upper jaw element 14, utilizing the same mechanical fastener 37 that joins the short piercing probe to the upper jaw element 14. Referring to FIG. 2, it can be seen that the long piercing probe 52 has a sharpened point 54. The direction of the sharpened point 54 can be changed by rotating the long piercing probe 52 around the mechanical fastener 37, as is shown by the hidden lines. When the sharpened point 54 of the long piercing probe 52 is rotated forward, the sharpened point 54 of the long piercing probe 52 extends forward beyond the front of the upper and lower jaw elements 14, 16. Conversely, when the sharpened point 54 of the long piercing probe 52 is rotated rearwardly, no part of the long piercing probe 52 extends beyond the tip of the upper and lower jaw elements 14, 16.

The long piercing probe 52 is conductive. Similarly, the mechanical fastener 37 that connects the long piercing probe 52 to the upper jaw element 14 is also conductive. As a result, the long piercing probe 52 and the upper jaw element 14 of the pliers 12 are electrically interconnected.

Returning to FIG. 1, it can be seen that a current flow indicator 42 is coupled to one of the handle elements 18 of the pliers 12 at a point in between the insulating material 22 and the pivot 25. The current flow indicator 42 can be any device that is capable of producing a perceivable indication as to the flow of current. For example, the current flow indicator 42 can be a buzzer or a gauge. In the preferred embodiment, the current flow indicator 42 is a light source, such as an incandescent bulb or an LED. The current flow indicator 42 has two terminals (not shown) through which current flows. One terminal of the current flow indicator 42 is grounded to the handle element 22. The second terminal of the current flow indicator 42 is connected to a lead wire 44. The lead wire 44 extends to a clamp 46 that is connected to the pliers 12 solely by the lead wire 44. The clamp 46 can be any mechanism capable of electrically connecting to an object or surface having an electrical ground potential.

Figure 3:
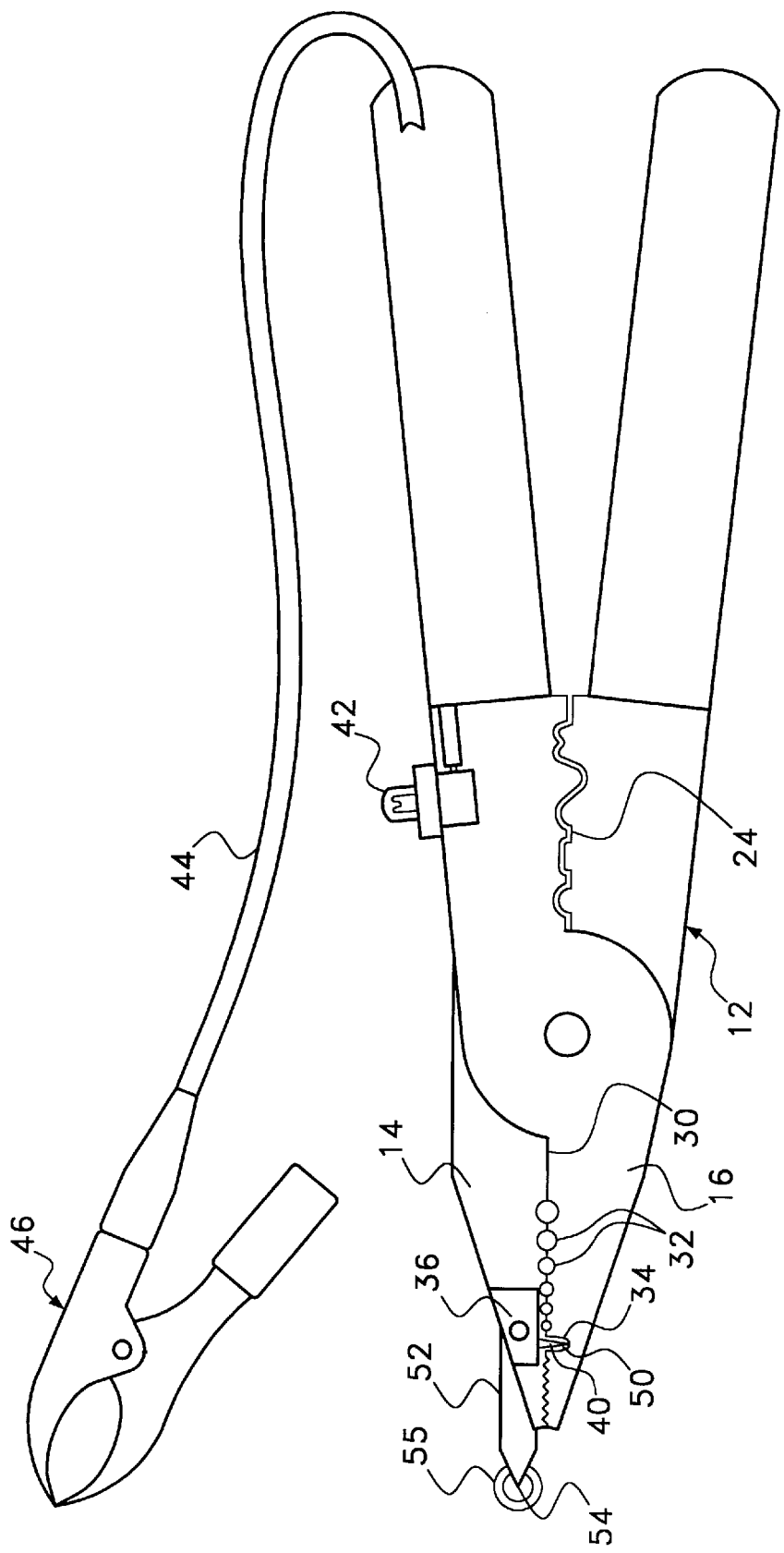
FIG. 3 is a front view of the embodiment of FIG. 1 shown in a closed condition.

The present invention device can test for current in a wire by piercing that wire with either the short piercing probe or the long piercing probe. Referring to FIG. 3, it can be seen that in order for the pliers 12 to test for current in a wire 50 with the short piercing probe 40, a wire 50 is positioned in the semicircular relief 34 in the lower jaw element 16. The handle elements 18, 20 of the pliers 12 are then manually moved toward one another. As a result, the upper jaw element 14 closes upon the lower jaw element 16 and the short piercing probe 40 engages and penetrates the insulation of the wire 50 being tested. The wire 50 being tested is prohibited from moving by its presence within the semicircular relief 34. As a result, the short piercing probe 40 automatically becomes properly aligned with the wire 50 when the pliers 12 begin to close. The force by which the short piercing probe 40 is biased against the wire 50 is controlled entirely by how hard a person manually biases the handle elements 18, 20 of the pliers toward one another. As such, the short piercing probe 40 can very gently pierce a small wire or can aggressively pierce an armored wire as needed for a given situation.

If a wire to be tested is positioned in a highly confined area, the long piercing probe 52 can be used to test that wire 55. To utilize the long piercing probe 52, the sharpened point 54 of the long piercing probe 52 is rotated to the forward position so that the sharpened point 54 protrudes forward of the upper and lower jaw elements 14, 16. Once in this position, the sharpened point 54 of the long piercing probe can be biased against a wire 55 until the sharpened point 54 pierces the insulation surrounding the wire 55 and the long piercing probe 52 makes electrical contact with the conductive core of the wire 55.

To use the pliers 12 as a circuit tester, the clamp 46 at the end or the lead wire 44 is connected to an electrical ground. Different test wires are then either placed in the jaw elements 14, 16 of the pliers 12 or are engaged with the long piercing probe 52. If a test wire 50 contains current, an electric circuit is complete. The current flows from the wire 50 into either the long piercing probe 52 or a short piercing probe 40. The current then flows into the conductive protrusion 36 and the jaw element 14. The current flows through the body of the pliers 12 to the first terminal of the current flow indicator 42. Lastly, the current flows through the lead wire 44 to the clamp 46 and to the electrical ground. As the current flows through the current flow indicator 42, the current lights a light, sounds a buzzer, moves a gauge or otherwise provides a perceptive indication that current is present. If current is present in one part of a wire 50 but is not present further in that same wire, it can be assumed that the wire 50 being tested is internally broken. In such a scenario, a person testing the wire 50 can cut the wire 50, remove the defective section and replace the defective section using the cutting region 30, splicing reliefs 32 and crimping region 24 of the pliers 12. Consequently, a person does not have to change tools in order to both find and fix a broken wire.

It will be understood that the embodiments of the invention described above are merely exemplary and a person skilled in the art of tool manufacture could make many alternate embodiments using functionally equivalent components to those described. All such modifications are intended to be covered by the present invention as expressed by the appended claims.

What is claimed is:

1. A tool comprising:
    two conductive elements, each having a jaw section and a handle section;
    a pivot connecting said conductive elements together, wherein said jaw section and said handle section of each of said conductive elements are oriented on either side of said pivot, thereby enabling said conductive elements to be selectively rotated about said pivot between a closed condition where said jaw section of each of said conductive elements abut and an open condition where said jaw section of each of said conductive elements are separated;
    a retractable first conductive piercing probe mechanically and electrically coupled to one said jaw section, said first conductive piercing probe being selectively positionable between a retracted position and an extended position, wherein said first conductive piercing probe protrudes beyond said jaw section when in said extended position and does not extend beyond said jaw section when in said retracted position;
    a second conductive piercing probe mechanically and electrically coupled to one said jaw section;
    a relief defined in one said jaw section opposite said second conductive piercing probe, wherein said second conductive piercing probe extends into said relief when said conductive elements are in said closed condition;
    a current flow indicator electrically coupled to one of said conductive elements; and
    a flexible wire electrically coupled to said current flow indicator, whereby any flow of current through said conductive elements to said flexible wire passes through said current flow indicator.

2. The tool according to claim 1, wherein said first conductive piercing probe has a sharpened tip at one end.

3. The tool according to claim 2, wherein said first conductive piercing probe is pivotably coupled to one said jaw section, thereby enabling said first conductive piercing probe to be selectively rotated between said extended position and said retracted position.

4. The tool according to claim 1, wherein each said jaw section contains a sharpened cutting region that aligns when said conductive elements are in said closed condition.

5. The tool according to claim 1, wherein each said jaw section contains wire stripping reliefs that align when said conductive elements are in said closed condition.

6. The tool according to claim 1, wherein each said jaw section has a gripping region that aligns when said conductive elements are in said closed condition.

7. The tool according to claim 1, wherein each said handle section contains crimping regions that align when said conductive elements are in said closed condition.

8. The tool according to claim 1, wherein said flexible wire terminates with a clamp at a point remote from said conductive elements.

9. The tool according to claim 1, wherein said current flow indicator is selected from a group consisting of incandescent lights, LEDs, gauges and audible indicators.

10. The tool according to claim 1, wherein said first conductive piercing probe and said second conductive piercing probe are affixed to one said jaw section with a single common mechanical fastener.

11. A pair of pliers, comprising:
    a pair of handles;
    a pair of jaws coupled to said handles wherein said jaws can be selectively moved between an open condition and a closed condition by the selective manual manipulation of said handles;
    a retractable first probe coupled to one of said jaws, said retractable first probe being selectively positionable between an extended position, where said first probe extends beyond said jaws, and a retracted position, where said first probe does not extend beyond said jaws;
    a second probe extending from one of said jaws toward the other; and
    a current flow indicator electrically coupled to both said first probe and said second probe wherein said current flow indicator provides a perceivable indication as to the flow of current through either probe.

12. The pliers according to claim 11, wherein said first probe has a sharpened point at one end.

13. The pliers according to claim 12, wherein said first probe is coupled to said pliers with a pivot that enables said first probe to be selectively rotated between said extended position and said retracted position.

14. The pliers according to claim 11, wherein said jaws both contain a sharpened cutting region that align when said jaws are in said closed condition.

15. The pliers according to claim 11, wherein said jaws both contain wire stripping reliefs that align when said jaws are in said closed condition.

16. The pliers according to claim 11, wherein said jaws both contain a gripping region that align when said jaws are in said closed condition.

17. The pliers according to claim 11, wherein said handles contain crimping regions that align when said handles are in said closed condition.

18. The pliers according to claim 11, wherein said handles contain regions covered with an electrical insulating material.

19. The pliers according to claim 11, further including a flexible wire electrically coupled to said current flow indicator.

20. The pliers according to claim 11, wherein said current flow indicator is selected from a group consisting of incandescent lights, LEDs, gauges and audible indicators.

* * * * *